United States Patent
Chou et al.

(10) Patent No.: US 7,601,587 B2
(45) Date of Patent: Oct. 13, 2009

(54) FABRICATING METHOD OF CMOS

(75) Inventors: Pei-Yu Chou, Anding Township, Tainan County (TW); Min-Chieh Yang, Kaohsiung (TW); Wen-Han Hung, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 45 days.

(21) Appl. No.: 11/924,571

(22) Filed: Oct. 25, 2007

(65) Prior Publication Data
US 2008/0096343 A1 Apr. 24, 2008

Related U.S. Application Data

(63) Continuation-in-part of application No. 11/164,274, filed on Nov. 16, 2005, now Pat. No. 7,303,962.

(51) Int. Cl.
*H01L 21/8242* (2006.01)

(52) U.S. Cl. ...................................... 438/251

(58) Field of Classification Search ............... None
See application file for complete search history.

(56) References Cited

U.S. PATENT DOCUMENTS

2007/0187727 A1* 8/2007 Ting et al. .................... 257/274
2008/0128831 A1* 6/2008 Chou et al. ................... 257/401
2008/0296631 A1* 12/2008 Chen et al. ................... 257/254

FOREIGN PATENT DOCUMENTS

CN 1445838 10/2003

* cited by examiner

*Primary Examiner*—Charles D. Garber
*Assistant Examiner*—Andre' C Stevenson
(74) *Attorney, Agent, or Firm*—Jianq Chyun IP Office (57) ABSTRACT

A method of forming a metal-oxide-semiconductor (MOS) device is provided. The method includes the following steps. First, a conductive type MOS transistor is formed on a substrate. Then, a first etching stop layer is formed over the substrate to cover conformably the conductive type MOS transistor. Thereafter, a stress layer is formed over the first etching stop layer. Then, a second etching stop layer is formed over the stress layer.

10 Claims, 6 Drawing Sheets

FABRICATING METHOD OF CMOS

CROSS-REFERENCE TO RELATED APPLICATION

This application is a continuation-in-part of a prior application Ser. No. 11/164,274, filed Nov. 16, 2005. The entirety of the above-mentioned patent application is hereby incorporated by reference herein and made a part of this specification.

BACKGROUND OF THE INVENTION

1. Field of the Invention

The present invention relates to a semiconductor device and fabricating method thereof. More particularly, the present invention relates to a complementary metal-oxide-semiconductor (CMOS) device and a metal-oxide-semiconductor (MOS) device and their fabricating methods therefore.

2. Description of the Related Art

In the development of integrated circuit devices, higher operating speed and a lower power consumption is often achieved by reducing the size of each device. However, further reduction in the dimension of each device is subjected to factors including the bottleneck in the fabricating technique and the expense in the production. Consequently, other types of techniques different from the technique of miniaturizing devices have been developed to improve the driving current of devices. With this background, somebody has proposed the utilization of the stress in the channel region of a transistor to combat the limits in device miniaturization. The method uses stress to change the pitch of silicon crystal grid so that the mobility of electrons and holes is increased and lead to a higher device performance.

One of the conventional method of utilizing stress to increase device performance includes using the stress in a silicon nitride layer that serves as a contact etching stop layer to influence the driving current of the device. Although the driving current in the n-channel region will increase when the tensile stress of the silicon nitride layer is increased, the driving current in the p-channel region will drop. Conversely, although the driving current in the p-channel will increase when the compressive stress of the silicon nitride layer is increased, the driving current of the n-channel region will drop. In other words, the method of using the stress in a silicon nitride layer to improve the performance of the transistor can be used only for increasing the driving current of a N-type metal-oxide-semiconductor (NMOS) transistor or the driving current of a P-type metal-oxide-semiconductor (PMOS) transistor. There is no way to increase the driving current of both the NMOS transistor and the PMOS transistor at the same time.

To increase the driving current of NMOS transistor and PMOS transistor simultaneously, a method for forming a semiconductor device with the following steps is proposed. First, an NMOS transistor and a PMOS transistor are formed on a substrate such that a shallow trench isolation (STI) structure is also formed between the two transistors. Hence, the NMOS transistor and the PMOS transistor are electrically isolated. Thereafter, a silicon nitride layer with tensile stress is deposited to cover up the entire substrate. After that, a patterned photoresist layer is formed over the silicon nitride layer with tensile stress to expose the silicon nitride layer above the PMOS transistor. Using the patterned photoresist layer as a mask, an etching process is performed to remove the exposed silicon nitride layer while retaining the silicon nitride layer on the NMOS transistor. Then, the patterned photoresist layer is removed. Afterwards, using a similar method, another silicon nitride layer with compressive stress is deposited over the entire substrate. Then, the silicon nitride layer above the NMOS transistor is removed while retaining the silicon nitride layer with compressive stress over the PMOS transistor. Consequently, a silicon nitride layer with tensile stress is formed over the NMOS transistor while another silicon nitride layer with compressive stress is formed over the PMOS transistor. In other words, the driving current of both the NMOS transistor and the PMOS transistor is increased simultaneously.

Although the aforesaid method can increase the driving current of both the NMOS transistor and the PMOS transistor, a few problems that may affect the driving current and performance of the transistors are not tackled. For example, in areas where the pitch between devices is small, the silicon nitride layer at different stress levels may merge together and doubling the thickness of the silicon nitride layer there. Therefore, the silicon nitride layer needs to be over-etched in an etching operation in order to ensure the silicon nitride layer not covered by the photoresist is completely removed. However, this extended etching may damage the film layers and elements such as the spacers and silicone dioxide layer and nickel-silicide of STI structure in the no-transistor region underneath the silicon nitride layer. Ultimately, there will be some adverse effects on the performance of the device.

SUMMARY OF THE INVENTION

Accordingly, at least one objective of the present invention is to provide a method of forming a complementary metal-oxide-semiconductor (CMOS) device that can prevent possible damages to film layers and increase the performance of the device.

To achieve these and other advantages and in accordance with the purpose of the invention, as embodied and broadly described herein, the invention provides a method of forming a complementary metal-oxide-semiconductor (CMOS) device comprising the following steps. First, a substrate is provided. The substrate has a first active region and a second active region. The first active region is isolated from the second active region through an isolation structure. Then, a first type of metal-oxide-semiconductor (MOS) transistor and a second type of MOS transistor are formed on the first active region and the second active region of the substrate respectively. Thereafter, a first etching stop layer is formed on the substrate to cover conformably the first type of MOS transistor, the second type of MOS transistor and the isolation structure. Then, a first stress layer and a second etching stop layer are formed in sequence over the first etching stop layer. The second etching stop layer and the first stress layer in the second active region are removed. A second stress layer is formed over the substrate to cover the first etching stop layer and the second etching stop layer. Then, a third etching stop layer is formed on the second stress layer in the second active region. The third etching stop layer and the second stress layer in the first active region are removed.

According to the embodiment of the present invention, a curing process may be carried out after forming the first stress layer. And a curing process may be carried out after forming the second stress layer.

According to the embodiment of the present invention, each of the first etching stop layer, the second etching stop layer and the third etching stop layer is fabricated using silicon oxide, silicon oxynitride, silicon carbide, silicon carbonate or silicon-carbon nitride and a total thickness of them is between 50 Å~350 Å, for example.

According to the embodiment of the present invention, the first stress layer is fabricated using silicon nitride, for example. Similarly, the second stress layer is fabricated using silicon nitride, for example.

According to the embodiment of the present invention, if the first type of MOS transistor is an N-type metal-oxide-semiconductor (NMOS) transistor and the second type of MOS transistor is a P-type metal-oxide-semiconductor (PMOS) transistor, then the first stress layer is a tensile stress layer and the second stress layer is a compressive stress layer. On the other hand, if the first type of MOS transistor is a P-type metal-oxide-semiconductor (PMOS) transistor and the second type of MOS transistor is an N-type metal-oxide-semiconductor (NMOS) transistor, then the first stress layer is a compressive stress layer and the second stress layer is a tensile stress layer.

According to the embodiment of the present invention, the method of removing the second etching stop layer and the first stress layer in the second active region comprises the following steps. A first photoresist layer is formed over the second etching stop layer in the first active region. The second etching stop layer and a portion of the first stress layer in the second active region is removed by using the first photoresist layer as a mask. The first photoresist layer, the first stress layer and a portion of the first etching stop layer in the second active region are simultaneously removed.

According to the embodiment of the present invention, the method of removing the third etching stop layer and the second stress layer in the first active region comprises the following steps. A second photoresist layer is formed over the third etching stop layer in the second active region. The third etching stop layer and a portion of the second stress layer in the firstd active region are removed by using the second photoresist layer as a mask. The second photoresist layer, the second stress layer and a portion of the second etching stop layer in the first active region are simultaneously removed.

According to the embodiment of the present invention, the first and second curing processes are a UV curing process, respectively.

In the present invention, an etching stop layer is formed between the stress layer and the transistor. Hence, the problem of damaging the spacers and silicone dioxide layer and nickel-silicide of STI structure in the no-transistor region as in a conventional method can be avoided. Furthermore, the presence of the etching stop layer in the present invention will not affect the properties of the stress layer and hence degrade the stress layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic cross-sectional views showing the steps for forming a MOS device according to one embodiment of the present invention. First, referring to FIG. 1A, a conductive type metal-oxide-semiconductor (MOS) transistor 102 is formed on a substrate 100. In the present embodiment, the conductive type MOS transistor 102 is an N-type MOS transistor, for example. The conductive type MOS transistor 102 comprises a gate dielectric layer 104, a gate 106, a pair of source/drain regions 108 and a pair of spacers 110. In one embodiment, a metal silicide layer (not shown) may also be formed on the gate 106 and the source/drain regions 108 to lower the resistance. The metal silicide layer is fabricated using nickel silicide, tungsten silicide or cobalt silicide, for example. Since the elements of the conductive type MOS transistor 102, the materials constituting the elements and the method of fabricating the conductive type MOS transistor 102 should be familiar to those knowledgeable in this field, a detailed description is omitted.

Figure 1A:
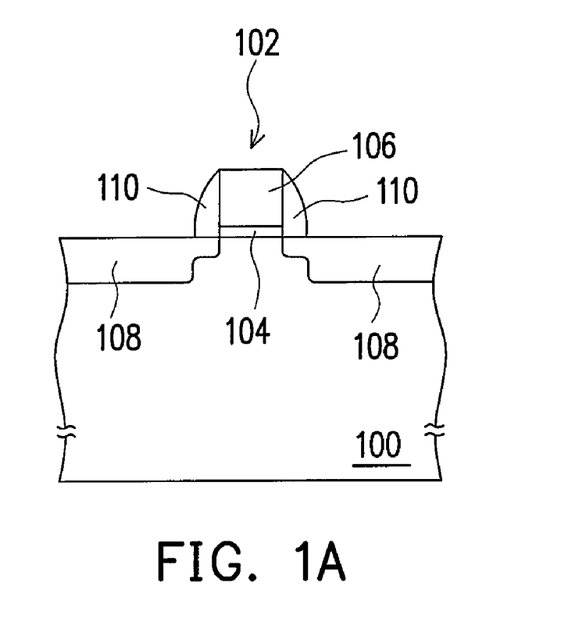
FIGS. 1A through 1D are schematic cross-sectional views showing the steps for forming a MOS device according to one embodiment of the present invention.
Figure 1B:
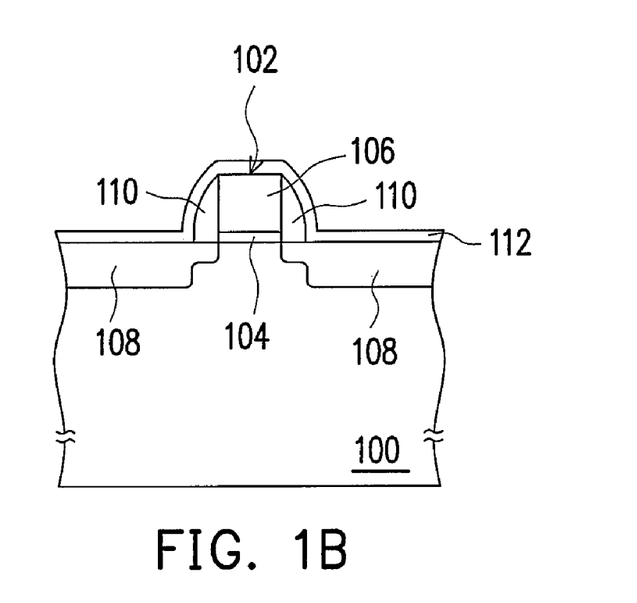

Referring to FIG. 1B, an etching stop layer 112 is formed over the substrate 100 to cover conformably the conductive type MOS transistor 102. The etching stop layer 112 has a thickness smaller than 500 Å, preferably between about 50 Å. The etching stop layer 112 is fabricated using silicon oxide, silicon oxynitride, silicon carbide, silicon carbonate or silicon-carbon nitride, for example. The etching stop layer 112 is formed, for example, by performing a chemical vapor deposition process or other suitable process.

Figure 1C:
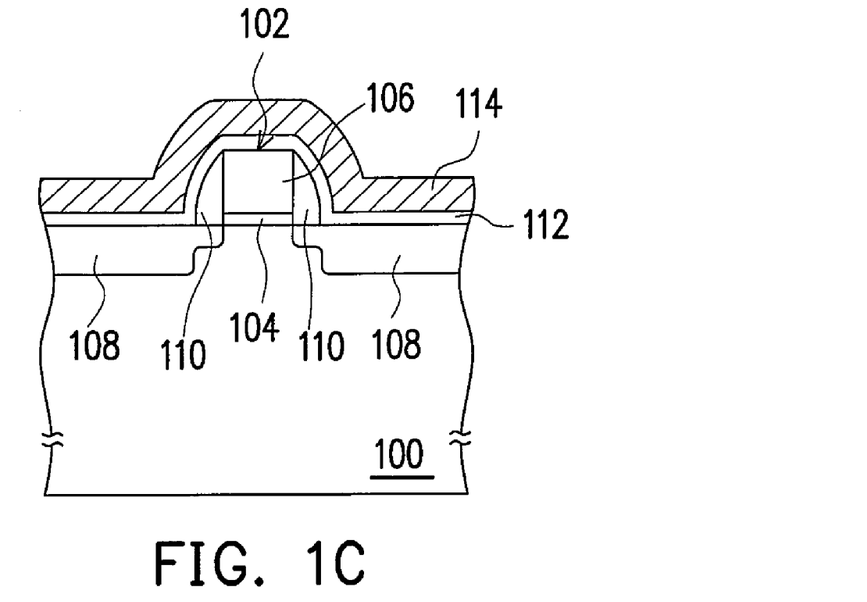

Referring to FIG. 1C, a stress layer 114 is formed over the etching stop layer 112. The stress layer 114 is a silicon nitride layer having a thickness between 600 Å~1500 Å, for example. Because the conductive type MOS transistor 102 in the present embodiment is an NMOS transistor, the stress layer 114 is a tensile stress layer.

In one embodiment, a curing process may be carried out after forming the stress layer 114 for increasing the tensile stress in the stress layer 114. The aforesaid curing process is an ultraviolet curing process, for example.

Figure 1D:
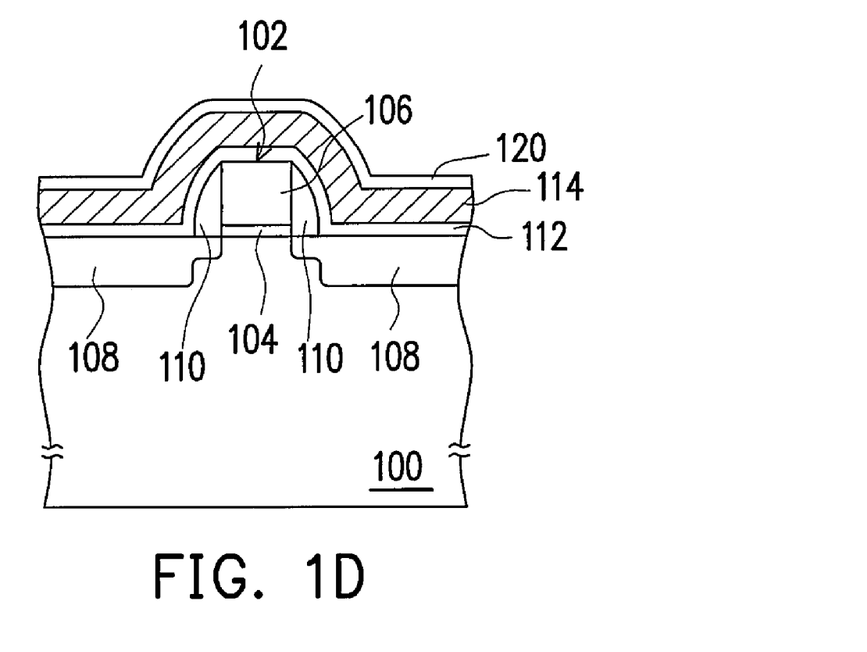

Referring to FIG. 1D, an etching stop layer 120 is formed over the stress layer 114. The etching stop layer 120 has a thickness smaller than 500 Å. The etching stop layer 120 is fabricated using silicon oxide, silicon oxynitride, silicon carbide, silicon carbonate or silicon-carbon nitride, for example. The etching stop layer 120 is formed, for example, by performing a chemical vapor deposition process or other suitable process.

Obviously, subsequent processes of forming interconnects can be carried out after forming the etching stop layer 120. The interconnect fabrication process includes, for example, forming a dielectric layer (not shown) over the etching stop layer 120 and forming a contact opening (not shown) in the dielectric layer, the etching stop layer 120, the stress layer 114 and the etching stop layer 112. Thereafter, a conductive layer (not shown) is formed in the contact opening to serve as a contact so that corresponding devices are electrically connected together.

Obviously, the conductive type MOS transistor 102 in the foregoing embodiment is illustrated using a NMOS transistor. In another embodiment, the conductive type MOS transistor 102 can be a PMOS transistor. In that case, the stress layer 114 is a compressive stress layer.

In the aforementioned embodiment, the formation of a stress layer on the conductive type MOS transistor can affect the driving current of the device and improve the performance of the device. In addition, the etching stop layer between the conductive type MOS transistor and the stress layer can be fabricated using a material having an etching selectivity ratio different from the silicon nitride layer, for example. Hence, the etching stop layer can prevent possible damage to the spacers and silicone dioxide layer and nickel-silicide of STI structure in the no-transistor region.

In the following, a MOS device fabricated using the aforementioned method is described. Referring to FIG. 1D, a metal-oxide-semiconductor (MOS) device comprising a conductive type MOS transistor 102, an etching stop layer 112, a stress layer 114 and an etching stop layer 120 is provided. The conductive type MOS transistor 102 is disposed on a substrate 100. The etching stop layer 112 is covered conformably the conductive type MOS transistor 102. The etching stop layer 112 has a thickness smaller than 500 Å, and preferably between about 50 Å. The etching stop layer 112 is fabricated using silicon oxide, silicon oxynitride, silicon carbide, silicon carbonate or silicon-carbon nitride, for example. Furthermore, the stress layer 114 is disposed on the etching stop layer 112 and has a thickness between 600 Å~1500 Å, for example. The etching stop layer 120 is disposed on the stress layer 114. The etching stop layer 120 has a thickness smaller than 500 Å. The etching stop layer 120 is fabricated using silicon oxide, silicon oxynitride, silicon carbide, silicon carbonate or silicon-carbon nitride, for example. If the conductive type MOS transistor 102 is an N-type MOS (an NMOS) transistor, then the stress layer 114 is a tensile stress layer. On the other hand, if the conductive type MOS transistor 102 is a P-type MOS (a PMOS) transistor, then the stress layer 114 is a compressive stress layer.

Aside from the aforementioned embodiment, the present invention can also be implemented in another configuration. FIGS. 2A through 2H are schematic cross-sectional views showing the steps for forming a CMOS device according to one embodiment of the present invention. First, referring to FIG. 2A, a substrate 200 is provided. The substrate 200 has an active region 202 and an active region 204. The active regions 202 and 204 are isolated from each other through an isolation structure 206. The isolation structure 206 can be a shallow trench isolation (STI) structure or other suitable types of isolation structures, for example.

Figure 2A:
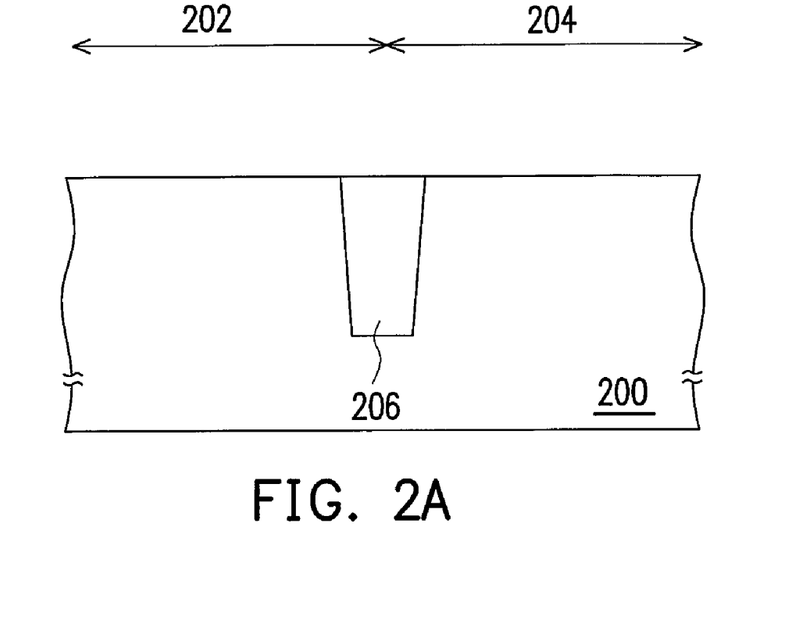
FIGS. 2A through 2H are schematic cross-sectional views showing the steps for forming a CMOS device according to one embodiment of the present invention.
Figure 2B:
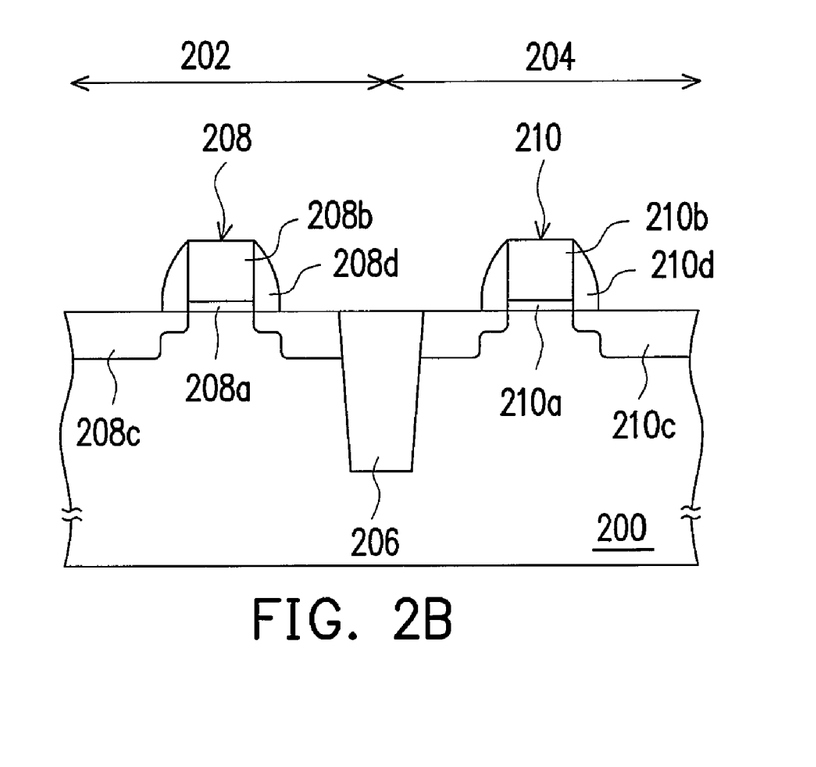

Referring to FIG. 2B, a first type of MOS transistor 208 and a second type of MOS transistor 210 are formed in the first active region 202 and the second active region 204 of the substrate 200 respectively. In the present embodiment, the first type of MOS transistor 208 and the second type of MOS transistor 210 are NMOS transistor and PMOS transistor respectively. The first type MOS transistor 208 comprises a gate dielectric layer 208a, a gate 208b, a pair of source/drain region 208c and a pair of spacers 208d. The second type MOS transistor 210 comprises a gate dielectric layer 210a, a gate 210b, a pair of source/drain region 210c and a pair of spacers 210d. In one embodiment, a metal silicide layer (not shown) can be formed on the gate 208b and the source/drain regions 208c and the gate 210b and the source/drain regions 210c to lower the resistance there. The metal silicide layer is fabricated using nickel silicide, tungsten silicide or cobalt silicide, for example. Since the various elements and materials constituting the aforementioned first type of MOS transistor 208 and second type of MOS transistor 210 and method of fabricating the same should be familiar to those persons knowledgeable in this technological field, a detailed description is omitted.

Figure 2C:
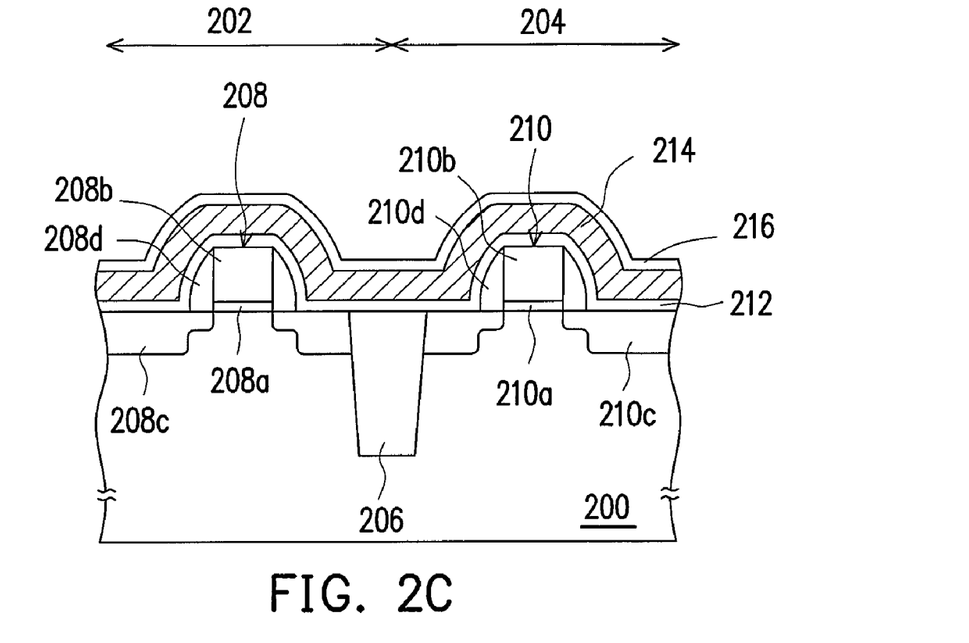

Referring to FIG. 2C, an etching stop layer 212 is formed over the substrate 200 to cover conformably the first type of MOS transistor 208, the second type of MOS transistor 210 and the isolation structure 206. The etching stop layer 212 has a thickness, for example, smaller than 500 Å, and preferably between about 50 Å. The etching stop layer 212 is fabricated using silicon oxide, silicon oxynitride, silicon carbide, silicon carbonate or silicon-carbon nitride, for example. The etching stop layer 212 is formed, for example, by performing a chemical vapor deposition process or other suitable process.

Thereafter, a stress layer 214 and an etching stop layer 216 are formed in sequence over the etching stop layer 212. In the present embodiment, the stress layer 214 is fabricated using silicon nitride, for example. The stress layer 214 serves as a tensile stress layer and has a thickness between about 600 Å~1500 Å. In addition, the etching stop layer 216 has a thickness, for example, smaller than 500 Å. The etching stop layer 216 is fabricated using silicon oxide, silicon oxynitride, silicon carbide, silicon carbonate or silicon-carbon nitride, for example. The etching stop layer 216 is formed, for example, by performing a chemical vapor deposition process or other suitable process. In one embodiment, a curing process may be carried out after forming the stress layer 214 so that the tensile stress in the stress layer 214 is further increased. The aforesaid curing process can be an ultraviolet curing process, for example.

Figure 2D:
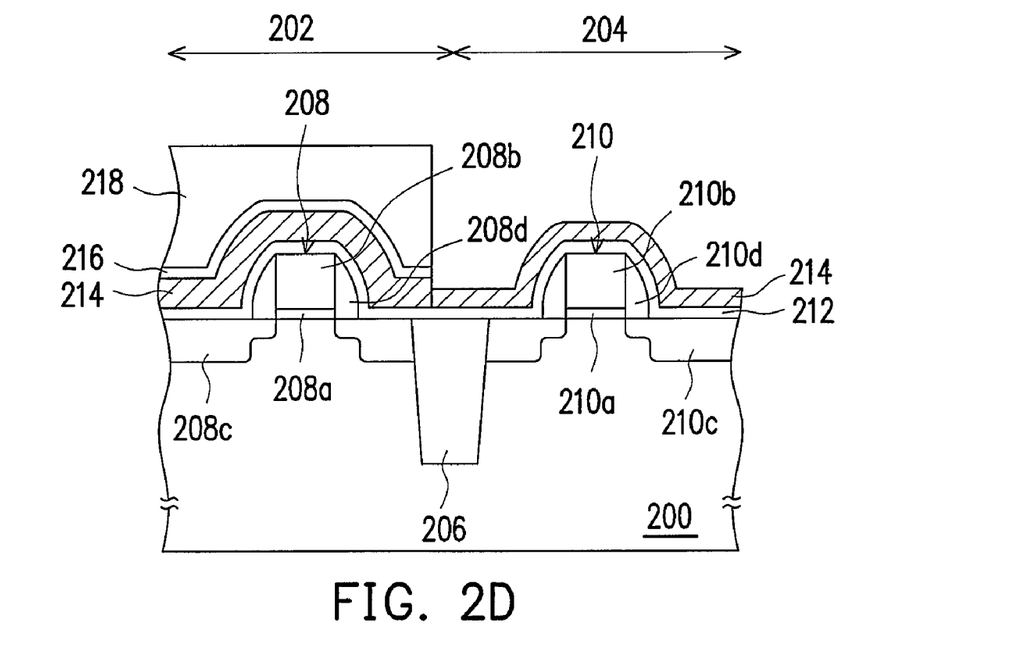

Referring to FIG. 2D, a photoresist layer 218 is formed on the etching stop layer 216 in the active region 202. Then, using the photoresist layer 218 as a mask, a portion of the etching stop layer 216 and a portion of the stress layer 214 in the active region 204 are removed to expose the etching stop layer 212. The method of removing the etching stop layer 216 and the stress layer 214 in the active region 204 includes performing an etching process, for example.

Figure 2E:
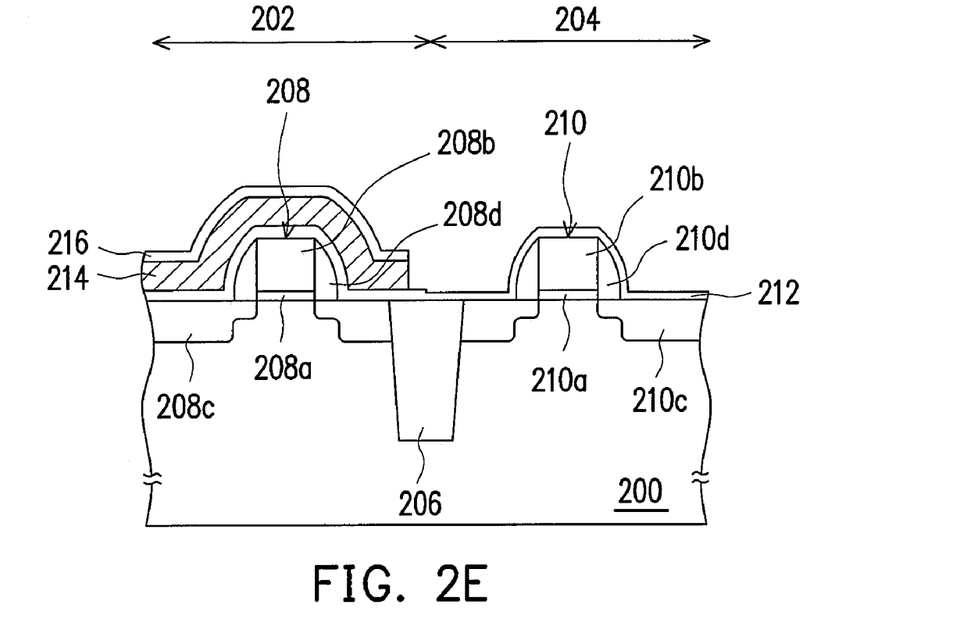

Referring to FIG. 2E, the photoresist layer 218, the stress layer 214 and a portion of the etching stop layer 212 in the active region 204 are simultaneously removed.

Figure 2F:
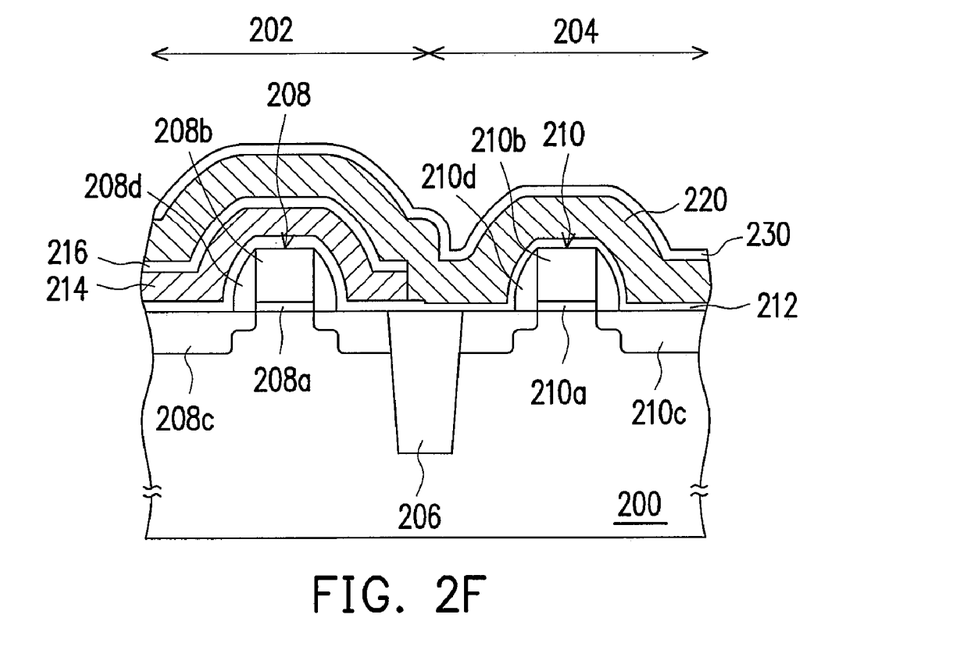

Referring to FIG. 2F, another stress layer 220 is formed over the substrate 200 to cover the etching stop layer 212 and the etching stop layer 216. In the present embodiment, the stress layer 220 is a silicon nitride layer, for example. The stress layer 220 is a compressive stress layer having a thickness between about 600Å~1500Å, for example. In one embodiment, a curing process may be carried out after forming the stress layer 220. The aforesaid curing process can be an ultraviolet curing process, for example. Then, an etching stop layer 230 is formed on the stress layer 220. The etching stop layer 230 is used as a hard mask in the etching process, and can be integrated into afterwards ILD process. The etching stop layer 230 is fabricated using silicon oxide, silicon oxynitride, silicon carbide, silicon carbonate or silicon-carbon nitride, for example. The etching stop layer 230 has a thickness smaller than 500Å. A total thickness of the etching stop layer 216 and 230 is between about 300Å.

Figure 2G:
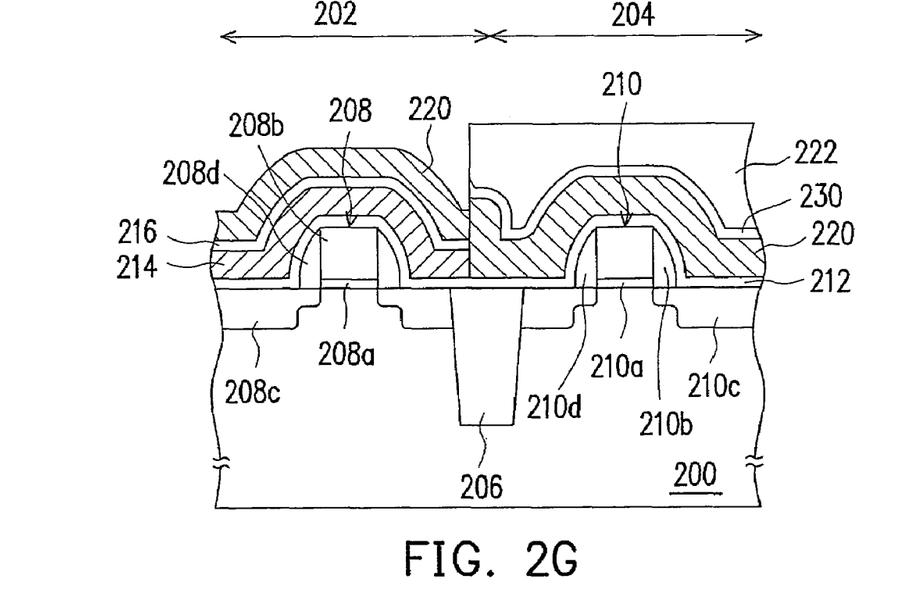

Referring to FIG. 2G a photoresist layer 222 is formed on the stress layer 220 in the active region 204. Then, using the photoresist layer 222 as a mask, the etching stop layer 230 and a portion of the stress layer 220 in the active region 202 are removed. The method of removing the etching stop layer 230 and a portion of the stress layer 220 in the active region 202 includes performing an etching operation, for example.

Figure 2H:
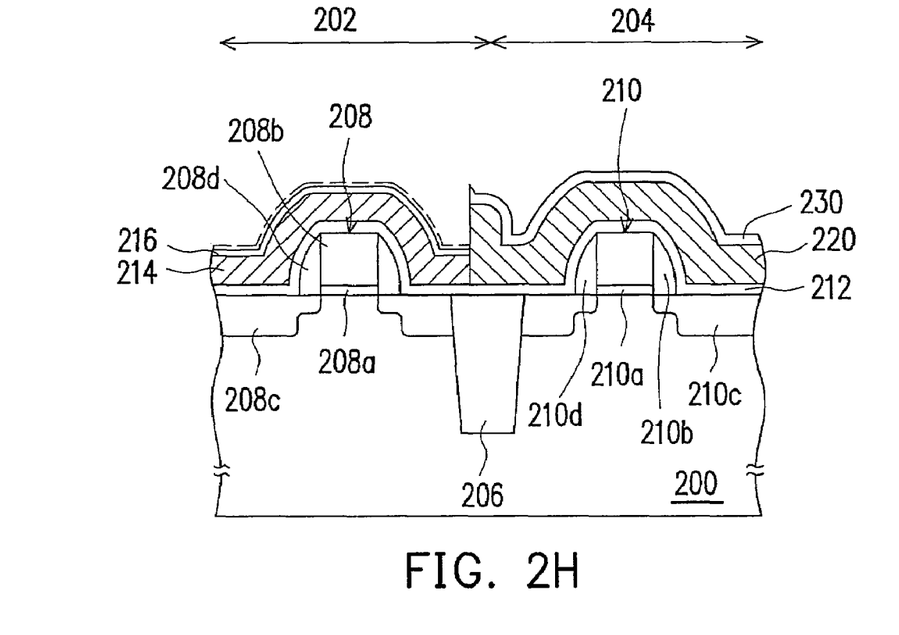

Referring to FIG. 2H, the photoresist layer 222, the stress layer 220 and a portion of the etching stop layer 216 in the active region 202 are simultaneously removed.

Obviously, subsequent processes for forming interconnects can be performed after forming the etching stop layer 230. In the process of fabricating interconnects, a dielectric layer (not shown) is formed over the substrate 200 to cover the etching stop layers 216 and 230. Then, a contact opening (not shown) is formed in the dielectric layer, the etching stop layers 216 and 230, the stress layers 214 and 220, and the etching stop layer 212. Thereafter, a conductive layer (not shown) is formed inside the contact opening to serve as a contact for electrically connecting corresponding devices together.

In the embodiment of the present invention, the etching stop layers 212 and 216 can be fabricated using the same material or different materials. Furthermore, the thickness of the etching stop layers 212 and 216 can be the same or can be different. There are no particular limitations in the present invention.

In the following, a complementary metal-oxide-semiconductor (CMOS) device fabricated using the aforesaid method is described. As shown in FIG. 2H, the CMOS device comprises a substrate 200, a first type of MOS transistor 208, a second type of MOS transistor 210, a first etching stop layer 212, a second etching stop layer 216, a third etching stop layer 230, a first stress layer 214 and a second stress layer 220. The substrate 200 has an active region 202 and an active region 204. The first active region 202 and the second active region 204 are isolated from each other through an isolation structure 206. The first type of MOS transistor 208 is disposed in the first active region 202 of the substrate 200 and the second type of MOS transistor 210 is disposed in the second active region 204 of the substrate 200. The etching stop layer 212 is covered conformably the first type of MOS transistor 208, the second type of MOS transistor 210 and the isolation structure 206. Furthermore, the stress layer 214 is disposed on the etching stop layer 212 in the first active region 202 and the stress layer 220 is disposed on the etching stop layer 214 in the second active region 204. The stress layers 214 and 220 are fabricated using silicon nitride, for example. The stress layer 214 is a tensile stress layer while the stress layer 220 is a compressive stress layer. Furthermore, the stress layers 214 and 220 have a thickness between about 600 Å~1500 Å, for example. The etching stop layer 216 is disposed on the stress layers 214 and the etching stop layer 230 is disposed on the stress layers 220. A total thickness of the etching stop layers 212, 216 and 230 is smaller than 500 Å, and preferably between 50 Å~350 Å, for example. Each of the etching stop layers 212, 216 and 230 is fabricated using silicon oxide, silicon oxynitride, silicon carbide, silicon carbonate or silicon-carbon nitride, for example.

In another embodiment, the first type of MOS transistor 208 is a PMOS transistor and the second type of MOS transistor 210 is an NMOS transistor. In this case, the stress layer 214 is a compressive stress layer and the stress layer 220 is a tensile stress layer.

It should be noted that a tensile stress layer is formed on an NMOS transistor and a compressive stress layer is formed on a PMOS transistor to affect the driving current of the device and increase the performance of the CMOS device at the same time. In addition, the etching stop layer in the embodiment can prevent possible damage to the spacers and silicone dioxide layer and nickel-silicide of STI structure in the no-transistor region so that the reliability of the process is improved.

In particular, the etching stop layer in the embodiment of the present invention protects the spacers and silicon dioxide layer and nickel-silicide of STI structure in the no-transistor region against possible damage without causing any adverse effect on the stress-related properties of the stress layer. The effect of the etching stop layer to the stress layer can be determined from a few tests. The results of the tests are listed in Table 1 below.

TABLE 1

|  | Ion gain | Ion gain (%) |
| --- | --- | --- |
| Experiment #1 | 1 | 0 |
| Experiment #2 | 1.0968 | 9.68 |
| Experiment #3 | 1.1019 | 10.19 |
| Experiment #4 | 1.0968 | 9.86 |

In Table 1, four different wafers are tested. In experiment #1, a tensile stress layer is formed on a substrate with devices thereon and an electrical test is performed thereafter. In experiment #2, a curing process is carried out after forming the stress layer and an electrical test is performed thereafter. In experiment #3, an etching stop layer with a thickness of about 100 Å and a tensile stress layer are formed in sequence over a substrate with devices thereon. The substrate is cured and then an electrical test is performed. In experiment #4, an etching stop layer with a thickness of about 150 Å and a tensile stress layer are formed in sequence over a substrate with devices thereon. The substrate is cured and then an electrical test is performed. In all the aforesaid experiments #1~4, the tensile stress layer has a thickness of about 1000 Å.

According to Table 1, the electrical test value, the ion gain, obtained in experiment #1 is used as a reference. The resulting electrical test values (Ion gains) in experiment #2~4 are 1.0968 (9.68%), 1.1019 (10.19%) and 1.0968 (9.68%) respectively. The foregoing results show that the electrical test values obtained from the experiment #3, 4 and the experiment #2 are very similar. In other words, the etching stop layer in the present invention has very little effect on the stress-related properties of the tensile stress layer and the degradation of the tensile stress layer is minimal.

Although the tests in Table 1 is performed to determine the effects to a tensile stress layer, the etching stop layer of the present invention similarly will not affect the stress-related properties of a compressive stress layer leading to a degradation of the compressive stress layer.

In summary, major advantages of the present invention includes at least:

1. The stress layer on the MOS transistor can affect the driving current of the device and improve device performance. Additionally, the present invention can increase the performance the NMOS device and the PMOS device at the same time.

2. The etching stop layer can avoid the problem of having any damage to the spacers and silicone dioxide layer and nickel-silicide of STI structure in the no-transistor region.

3. The etching stop layer formed between the MOS transistor and the stress layer in the present invention is able to protect the spacers and silicone dioxide layer and nickel-silicide of STI structure in the no-transistor region against possible damage without causing change in stress-related properties such as releasing the stress in the stress layer. In other words, the degradation of the stress layer is minimal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a complementary metal-oxide-semiconductor (CMOS) device, comprising:
   providing a substrate having a first active region and a second active region, wherein the first active region and the second active region are isolated from each other through an isolation structure;
   forming a first type of metal-oxide-semiconductor (MOS) transistor and a second type of MOS transistor on the first active region and the second active region of the substrate respectively;
   forming a first etching stop layer over the substrate to cover conformably the first type of MOS transistor, the second type of MOS transistor and the isolation structure;
   forming a first stress layer and a second etching stop layer in sequence over the first etching stop layer;
   removing the second etching stop layer and the first stress layer in the second active region;
   forming a second stress layer over the substrate to cover the first etchings stop layer and the second etching stop layer;
   forming a third etching stop layer over the second stress layer in the second active region; and
   removing the third etching stop layer and the second stress layer in the first active region.

2. The method of forming the CMOS device of claim 1, wherein after forming the first stress layer and after forming the second stress layer comprise performing a curing process.

3. The method of forming the CMOS device of claim 1, wherein the material constituting the first etching stop layer, the second etching stop layer and the third etching stop layer comprise silicon oxide, silicon oxynitride, silicon carbide, silicon carbonate or silicon-carbon nitride.

4. The method of forming the CMOS device of claim 1, wherein a total thickness of the first etching stop layer, the second etching stop layer and the third etching stop layer is between 50 Å~350 Å.

5. The method of forming the CMOS device of claim 1, wherein the material constituting the first stress layer and the second stress layer comprises silicon nitride.

6. The method of forming the CMOS device of claim 1, wherein the first type of MOS transistor is an N-type MOS (NMOS) transistor and the second type of MOS transistor is a P-type MOS (PMOS) transistor, then the first stress layer is a tensile stress layer and the second stress layer is a compressive stress layer.

7. The method of forming the CMOS device of claim 1, wherein the first type of MOS transistor is a P-type MOS (PMOS) transistor and the second type of MOS transistor is an N-type MOS (NMOS) transistor, then the first stress layer is a compressive stress layer and the second stress layer is a tensile stress layer.

8. The method of forming the CMOS device of claim 1, wherein the method of removing the second etching stop layer and the first stress layer in the second active region, comprising:
   forming a first photoresist layer over the second etching stop layer in the first active region;
   removing the second etching stop layer and a portion of the first stress layer in the second active region using the first photoresist layer as a mask; and
   removing the first photoresist layer, and simultaneously removing the first stress layer and a portion of the first etching stop layer in the second active region.

9. The method of forming the CMOS device of claim 1, wherein the method of removing the third etching stop layer and the second stress layer in the first active region, comprising:
   forming a second photoresist layer over the third etching stop layer in the second active region;
   removing the third etching stop layer and a portion of the second stress layer in the first active region using the second photoresist layer as a mask; and
   removing the second photoresist layer, and simultaneously removing the second stress layer and a portion of the second etching stop layer in the first active region.

10. The method of forming the CMOS device of claim 1, wherein the first and second curing processes are a UV curing process, respectively.

* * * * *